United States Patent [19]
Zamat et al.

[11] Patent Number: 5,896,421
[45] Date of Patent: Apr. 20, 1999

[54] USE OF LOW PASS FILTER AND EQUALIZER FOR NOISE REDUCTION IN DIRECT UP-CONVERSION SCHEMES

[75] Inventors: Hassan Zamat, San Diego, Calif.; Kumud S. Patel, Germantown; Brian K. Fair, Rockville, both of Md.

[73] Assignee: Hughes Electronics Corporation, El Segundo, Calif.

[21] Appl. No.: 08/721,786

[22] Filed: Sep. 25, 1996

[51] Int. Cl.$^6$ .................. H04K 1/02; H04L 25/03
[52] U.S. Cl. .......... 375/296; 375/298; 375/261; 375/229; 332/103
[58] Field of Search .................. 375/296, 298, 375/285, 261, 229, 230; 332/103, 107

[56] References Cited

U.S. PATENT DOCUMENTS

| | | |
|---|---|---|
| 4,700,151 | 10/1987 | Nagata . |
| 4,780,884 | 10/1988 | Karabinis ............... 375/261 |
| 5,091,919 | 2/1992 | Kuisma . |
| 5,193,223 | 3/1993 | Walczak et al. . |
| 5,323,329 | 6/1994 | Keane . |
| 5,334,945 | 8/1994 | Yokoya et al. . |
| 5,420,536 | 5/1995 | Faulkner et al. . |
| 5,517,491 | 5/1996 | Nanni et al. . |
| 5,521,943 | 5/1996 | Dambacher ............... 375/285 |
| 5,588,022 | 12/1996 | Dapper et al. ............... 375/298 |
| 5,629,961 | 5/1997 | Kawabata ............... 375/308 |

FOREIGN PATENT DOCUMENTS

| | | |
|---|---|---|
| 3-179927 | 8/1991 | Japan . |
| 3-283717 | 12/1991 | Japan . |
| 5-175880 | 7/1993 | Japan . |
| WO 92/11705 | 7/1992 | WIPO . |

*Primary Examiner*—Chi H. Pham
*Assistant Examiner*—Emmanuel Bayard
*Attorney, Agent, or Firm*—Michael W. Sales; John T. WHelan

[57] ABSTRACT

A transmitter in a base transceiver station in a wireless telephony network uses a direct up-conversion scheme to convert an input signal with in-phase and quadrature phase (I, Q) components to a radio frequency within a transmit band. A low-pass filter filters noise from the input signal components and a phase equalizer equalizes the phase distortions caused by the filtering in the input signal components. The signal components are then provided to an up-converter, such as a quadrature modulator, for conversion to a radio frequency signal within a transmit band. The transmitter of the present invention complies with the TIA'S 15-54 emission requirements.r connected to the first low pass filter and a second phase equalizer connected to the second low pass filter.

16 Claims, 4 Drawing Sheets

5,896,421

USE OF LOW PASS FILTER AND EQUALIZER FOR NOISE REDUCTION IN DIRECT UP-CONVERSION SCHEMES

BACKGROUND OF THE INVENTION

1. Field of the Invention

The present invention relates to noise reduction in a transmitter and, more particularly, to noise reduction in a transmitter in a cellular base transceiver station using a direct up-conversion scheme.

2. Description of Related Art

In a wireless telephony network several base transceiver stations are connected to a central switching office which serves as an interface between the base transceiver stations and a public wired telephone network or other wireless telephone switching offices. The base transceiver stations also communicate with mobile telephones or a multiscriber telephone system (such as an office or hotel) over selected radio frequency channels.

Some prior art transmitters in base transceiver stations include quadrature modulators, which are well known and have been widely used in digital and some analog modulation schemes. A typical prior art quadrature modulator 10 is shown in FIG. 1A signal having an in-phase component (I) and a quadrature phase component (Q) is input to the quadrature modulator 10. A first mixer 12 mixes an output of a local oscillator 14, operating at a center frequency $\omega_c$, in phase with the I signal components resulting in a signal Icos($\omega_c$t). A second mixer 16 mixes the output of the local oscillator 14, which is phase shifted by 90° by a phase shifter 18, with the Q signal component, resulting in a signal Qsin($\omega_c$t). A summer 20 then combines the two signals, resulting in a quadrature modulated signal Icos($\omega_c$t)+Qsin($\omega_c$t).

In a wireless telephony network, the frequency band is divided in 30 KHz channels. Wireless transmissions over a selected channel must comply with the Telecommunications Industry Association's (TIA) IS-54 specification, including emissions specification 3.4.1.1.B-(2) which states that the emission of a transmitter must be 80 dBc or lower than an unmodulated carrier at ±45 KHz or greater offset from the intermediate frequency in a 300 Hz bandwidth In order to meet this IS-54 specification, prior art transmitters in base transceiver stations implemented dual (or even triple) conversion techniques to filter out noise at the intermediate frequency. Such prior art systems used expensive surface acoustic wave (SAW) or crystal filters for noise filtering. Other prior art systems which implemented direct up-conversion techniques required expensive and bulky radio frequency filters to filter out noise.

FIG. 2 is a block diagram of a prior art dual conversion transmitter 22 using a SAW filter for noise reduction. Digitally modulated I and Q components of an input signal are provided to digital to analog (D/A) converters 24 and 26, respectively, where they are converted to analog signal components. The I and Q analog signal components are then provided to a first converter 28, which up-converts the signals to an intermediate frequency.

The first converter 28 comprises a quadrature modulator, as described in connection with FIG. 1, wherein a first mixer 30 mixes the I input signal component in-phase with an output of a local oscillator 32. A second mixer 34 and a phase shifter 36 mix the Q input signal component 90° out of phase with the output of the local oscillator 32. The outputs of the first and second mixers 30 and 34 are combined by a summer 38. The modulated signal output from the summer 38 is then passed through a bandpass SAW filter 40 with a center frequency equal to the intermediate frequency. The bandpass SAW filter 40 filters the noise at all frequencies outside of ±45 KHz of the intermediate frequency. Often, more than one SAW filter is required to adequately filter out noise from the signal.

The output from the SAW filter 40 is then provided to a second converter 42, wherein a third mixer 44 combines the signal with the output of a synthesizer 46 to convert the signal to a radio frequency within a transmit band or channel. The radio frequency signal is then passed through a band pass filter 48, which filters out any spurious signals outside of the transmit channel. The resultant signal may then be amplified and transmitted to, for example, a mobile phone or a multisubscriber telephone system.

The prior art dual conversion system of FIG. 2 is complicated and expensive to implement because of the use of the SAW filter 40 and the need for the two separate converters 28 and 42. Thus, there remains a need for a simple, inexpensive system that allows for a direct up-conversion scheme in a transmitter that meets the stringent IS-54 emission requirements.

SUMMARY OF THE INVENTION

The present invention eliminates the need for a dual conversion scheme in a transmitter and also eliminates the need for SAW filters for noise filtering. The transmitter of the present invention uses a direct up-conversion scheme to convert an input signal with in-phase and quadrature phase components (I Q) to a radio frequency signal within a transmit band. A low pass filter filters noise from the input signal components and a phase equalizer equalizes the phase distortions caused by the filtering in the input signal components. The signal components are then provided to an up-converter, such as a quadrature modulator, for conversion to a radio frequency signal within a transmit band.

According to a first aspect of the present invention, an apparatus for reducing noise in a transmitter comprises filtering means for receiving an input signal and filtering noise from the signal, phase equalizing means for equalizing phase distortions in the input signal and converting means for converting the input signal to a radio frequency signal within a transmit band.

According to another aspect of the present invention, an apparatus for reducing noise in a transmitter comprises a low pass filter for receiving the input signal and filtering noise from the signal and a phase equalizer for receiving an output of the low pass filter and equalizing the phase distortions in the input signal. An up-converter receives the input signal from the phase equalizer and converts the signal to a radio frequency within a transmit band.

According to yet another aspect of the present invention, a method for reducing noise in a direct up-conversion scheme comprises filtering noise from an input signal by passing the signal through a low pass filter, equalizing phase distortions in the input signal, and up-converting the filtered and equalized signal to a radio frequency signal within a transmit band.

BRIEF DESCRIPTION OF THE DRAWING(S)

DESCRIPTION OF THE PREFERRED EMBODIMENT(S)

Figure 1:
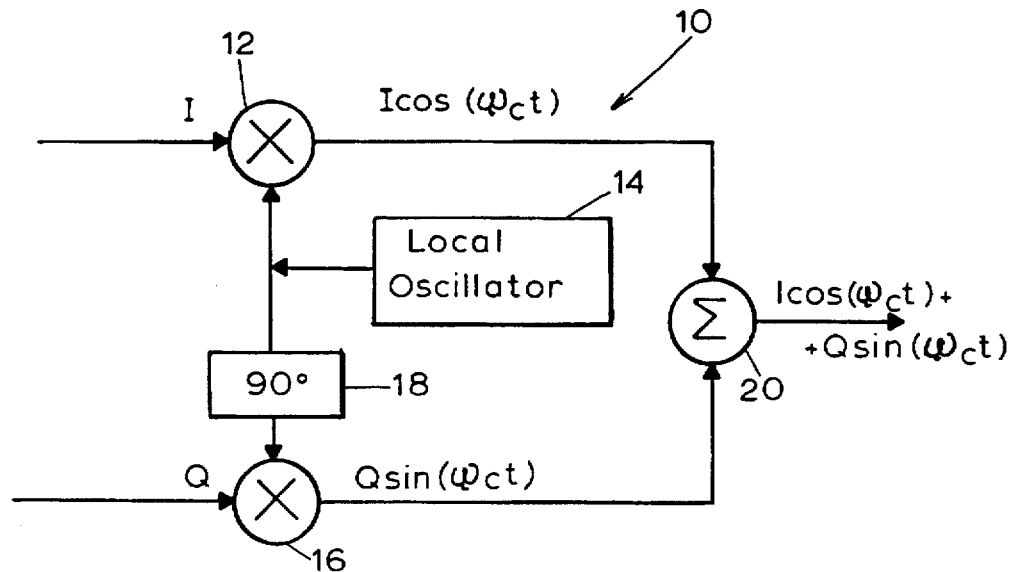
FIG. 1 is a block diagram of a typical prior art quadrature modulator.
Figure 2:
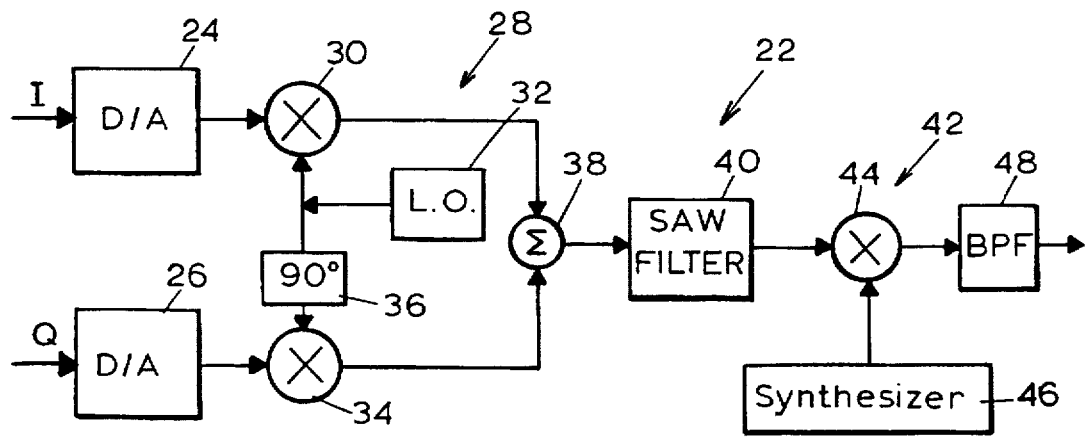
FIG. 2 is a block diagram of a prior art dual conversion transmitter which uses a SAW filter for noise reduction.
Figure 3:
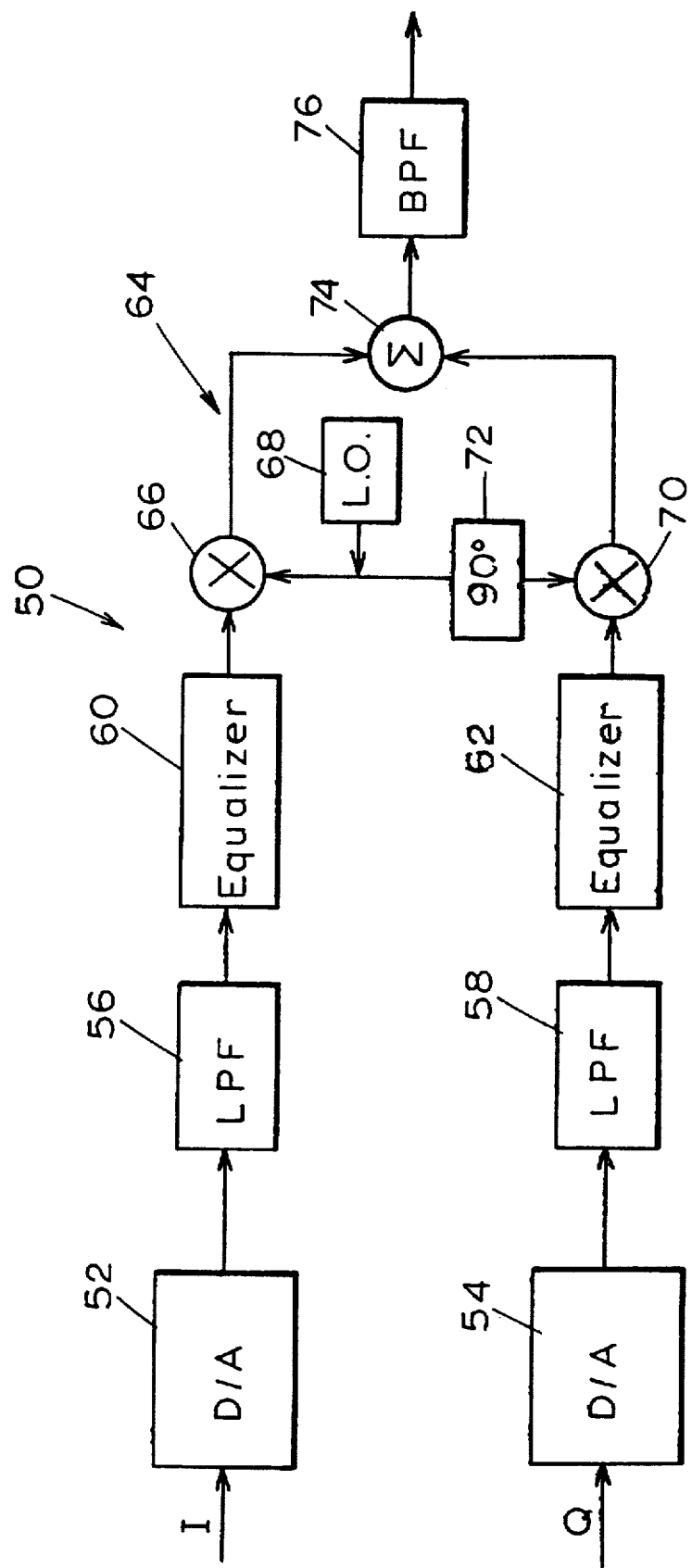
FIG. 3 is a simplified block diagram of a direct up-conversion transmitter of a preferred embodiment of the present invention.

FIG. 3 is a block diagram of a transmitter 50 which implements a direct up-conversion scheme according to the present invention. In the preferred embodiment, the transmitter 50 is included in a base transceiver station in a wireless telephony network and complies with the emission standards of IS-540 Digitally modulated inphase (I) and quadrature phase (Q) components of an input signal are provided to digital to analog (D/A) converters 52 and 54, respectively which converts them to analog signal components.

The digital to analog converters 52 and 54 introduce quantization noise into the input signal and the D/A integrated circuit used to implement the invention introduces addtional internal and terminal noise into the input signal In order to reduce or eliminate this noise from the signal, the output from the digital to analog converters 52 and 54 is passed through low pass filters 56 and 58, respectively.

In order to comply with the IS-54 emission requirement, the low pass filters 56 and 58 filter noise at 45 KHz. In a preferred embodiment the low pass filters 56 and 58 are all-pole filters, such as Chebyshev filters. A Chebyshev filter has a sharper roll-off near the cutoff frequency than, for example, a Butterworth filter. Thus, a Chebyshev filter provides better noise filtering at the 45 KHz cutoff frequency. The sharp roll-off provided by the Chebyshev filter, however, also produces increased rippling in the passband, which causes phase distortion in the input signal. This distortion is especially problematic where, as in the preferred embodiment, the cutoff frequency of the low pass filters (45 KSz) is close to the bandwidth of the input signal (30 KHz for a cellular transmit band).

In order to compensate for this phase distortion, the output of the low pass filters 56 and 58 is provided to phase equalizers 60 and 62, respectively. The phase equalizers 60 and 62 balance the phase distortions in the input signal components.

The outputs of the phase equalizers 60 and 62 are input to a quadrature modulator 64, which provides for direct up-conversion of the signal components to a radio frequency signal within a transmit band. The quadrature modulator 64 includes a first mixer 66 which mixes the filtered and equalized I component of the input signal in phase with an output of a local oscillator 68. The quadrature modulator 64 also includes a second mixer 70 and a phase shifter 72 which mix the filtered and equalized Q component of the input signal 90° out of phase with the output of the local oscillator 68. The output of the mixers 66 and 70 are then combined by a summer 74, resulting in a radio frequency signal within a transmit band.

In the preferred embodiment, the local oscillator 68 operates at a frequency between 869 and 894 MHz, which, when mixed with the input signal, results in a radio frequency signal within a cellular transmit band. Generally, each cellular transmit band has a bandwidth of 30 KHz.

The radio frequency signal output from the summer 78 is passed through a bandpass filter 76 to remove any spurious signals outside of the transmit band. The resultant signal may then be amplified and transmitted to, for example, a mobile phone or a multisubscriber telephone system.

Figure 4A:
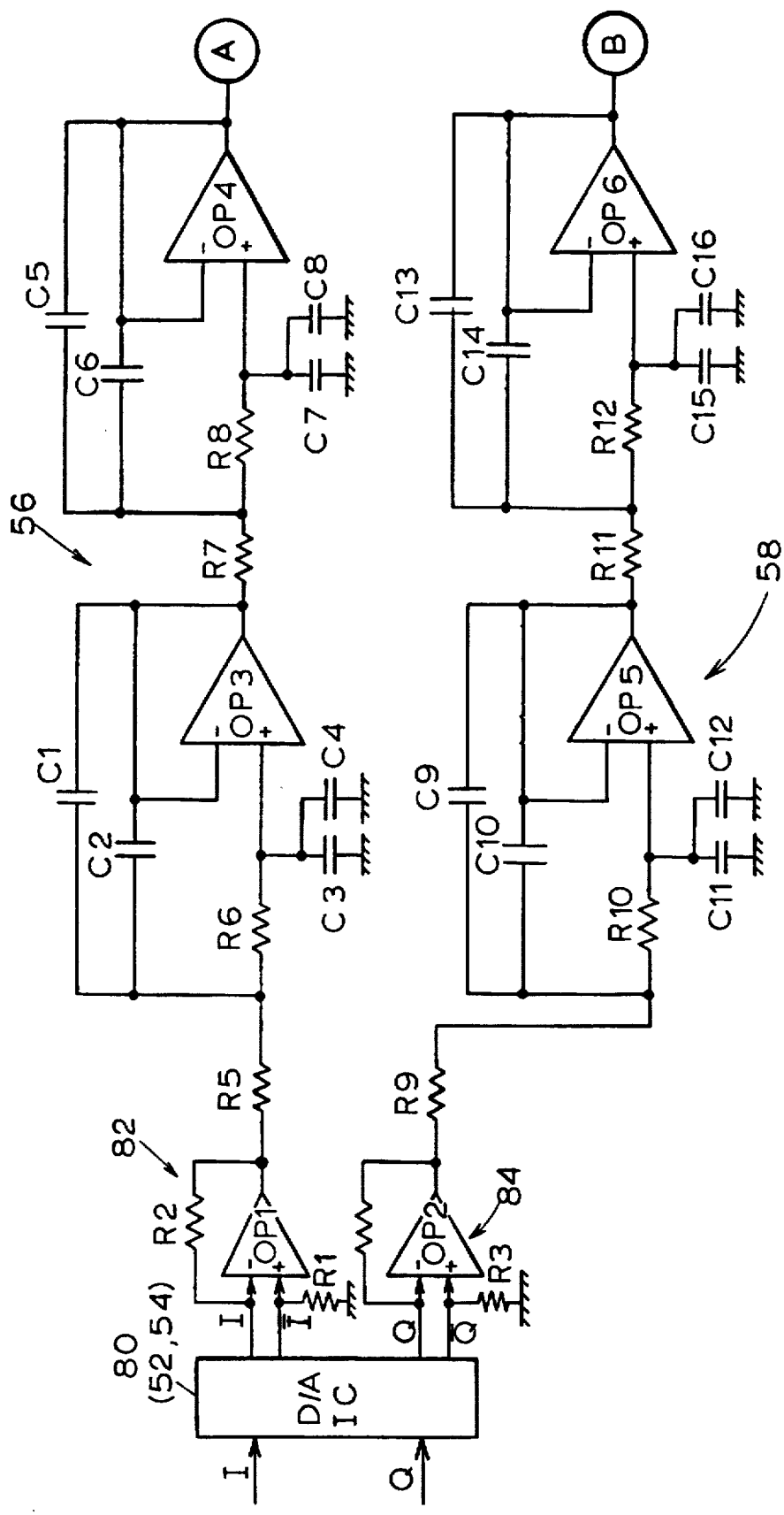
FIGS. 4A and 4B comprise a schematic diagram of a direct up-conversion transmitter of a preferred embodiment of the present invention.
Figure 4B:
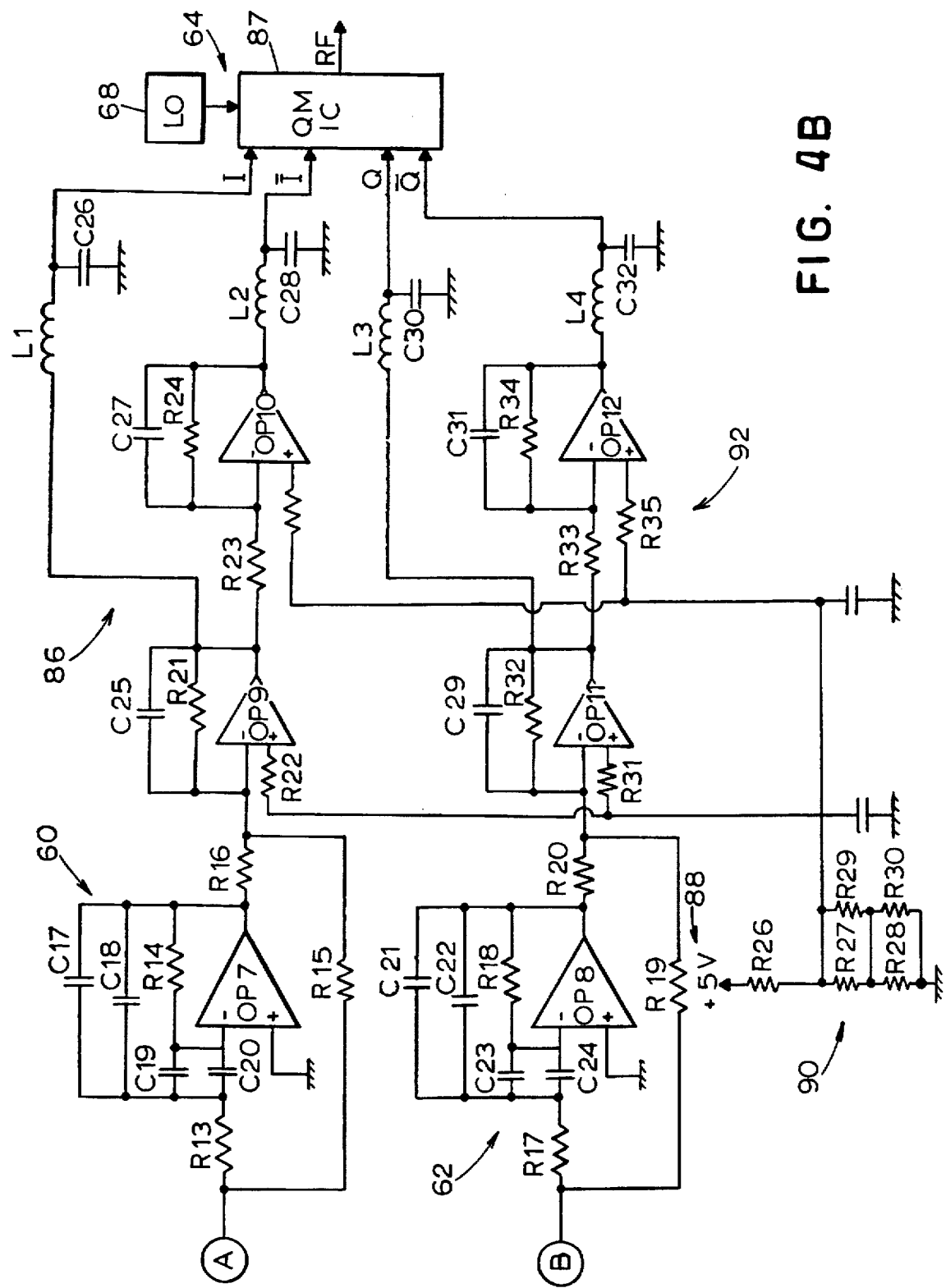

FIGS. 4A and 4B, when joined in side-by-side fashion at the similarly lettered lines, together comprise a schematic diagram of the direct up-conversion transmitter 50 of FIG. 3. For simplicity, the exact pin configurations of the integrated circuits and the power sources to the integrated circuits and operational amplifiers are not shown in the schematic diagram.

Referring to FIG. 4A, the digital to analog converters 52 and 54 are provided on a single digital to analog integrated circuit (D/A IC) 80. In a preferred embodiment, the D/A IC 80 comprises a Sony CXD1177 digital to analog converter. The D/A IC 80 receives the digitally modulated I, Q components of the input signal and converts them to analog. The D/A IC 80 outputs the analog signal components (I, Q) and also outputs the inverse of the signal components ($\bar{I}$, $\bar{Q}$).

The analog signal output from the D/A IC 80 is a current signal with a DC bias of approximately 1.2 volts. In order to eliminate this DC bias, the output from the D/A IC 80 is provided to the differential to single ended amplifiers 82 and 84. The I signal is provided to the negative input of operational amplifier OP1 across a resistor R2 in order to convert it to a voltage signal The inverse $\bar{I}$ signal is provided to the positive input of the operational amplifier OP1 across a resistor R1, also to convert it to a voltage signal. The operational amplifier subtracts the inverse $\bar{I}$ signal from the I signal, which cancels the DC bias from the signals and effectively doubles the AC output.

Similarly, the Q signal is provided to the negative input of the operational amplifier OP2 across a resistor R4 and the inverse $\bar{Q}$ signal is provided to the positive input of the operational amplifier OP2 across the resistor R3.

The I signal output from the differential to single ended amplifier 82 is provided to the low pass filter 56, which comprises a two stage Chebyshev filter. The first stage comprises an operational amplifier OP3 with resistor R6 and capacitors C1–C4 and the second stage comprises operational amplifier OP4 with resistor R8 and capacitors C5–C8.

The I signal output from the operational amplifier OP1 is connected to the positive input of operational amplifier OP3 across resistors R5 and R6. Capacitor C4 is connected between the positive input of the operational amplifier OP3 and grounds (Capacitors C3 and C2 are provided to allow for adjustments in the circuit). The configuration of the second stage of the low pass filter 56 (comprising operational amplifier OP4) is identical to that of the first stage. Because the I input signal is provided to the positive inputs of operational amplifiers OP3 and OP4, the polarity of the output signal from the low pass filter 56 is the same as the I input signal.

Similarly, the Q signal output from the differential to single ended amplifier 84 is provided to the low pass filter 58, which is also a two stage Chebyshev filter comprising a first operational amplifier OP5 with resistor R10 and capacitors C9–C12 and a second operational amplifier OP6 with resistor R12 and capacitors C13–C16. The configuration and operation of the low pass filter 58 is identical to that of the low pass filter 56.

Referring also to FIG. 4B, the filtered I signal output of the low pass filter 56 (ice. the output of the operational amplifier OP4) is provided to the phase equalizer 60, which comprises operational amplifier OP7 with associated resistors R13–R16 and capacitors C17–C20. The filtered I signal is provided to the negative input of the operational amplifier OP7, which reverses the polarity of the signal at the output (i.e. the output is the inverse I signal). The positive input of the operational amplifier OP7 is connected to ground.

Similarly, the filtered Q signal output of the low pass filter 58 (i.e. the output of the operational amplifier OP6) is provided to the phase equalizer 62, which comprises operational amplifier OP8 with resistors R17–R20 and capacitors C21–C24. The filtered Q signal is provided to the negative input of the operational amplifier OP8, which reverses the polarity of the signal at the output (i.e. the output is the inverse $\overline{Q}$ signal). The positive input of the operational amplifier OP8 is connected to ground.

The inverse $\overline{I}$ signal output of the phase equalizer 60, which appears at the output of operational amplifier OP7, is provided to a single ended to differential amplifier 86, which comprises a first operational amplifier OP9 with resistors R21–R22 and capacitor C25 and a second operational amplifier OP10 with resistors R23–R25 and capacitor C27. The inverse $\overline{I}$ signal is provided to the negative input of operational amplifier OP9 across resistor R16, which reverses the polarity of the signal. The resulting I signal is provided through an LC filter (comprising inductor L1 and C26) as an input to the quadrature modulator integrated circuit (QM IC) 87. The QM IC 87 is connected to the local oscillator 68, which together comprise the quadrature modulator 64. In a preferred embodiment, the QM IC 87 is an AT&T W2010 quadrature modulator. The QM IC 87 requires inputs of both the I, Q signals and the inverse $\overline{I}$, $\overline{Q}$ signals.

The positive input of operational amplifier OP9 is connected to a +5 volt DC voltage source 88 through a voltage divider 90 comprising resistors R26–R30. This provides an appropriate DC bias to the I signal, which is required by the QM IC 87. (If the QH IC 87 did not require the DC bias, this portion of the circuit could be excluded.)

The negative input of operational amplifier OP10 is provided with I signal from the output of operational amplifier OP9, which reverses the polarity of the I signal to generate the inverse $\overline{I}$ signal. The inverse $\overline{I}$ signal is then provided to the QH IC 87 through an LC filter (comprising inductor L2 and capacitor C28). The positive input of operational amplifier OP10 is also connected to the DC voltage source 88 through the voltage divider 90 to provide the DC bias to the inverse $\overline{I}$ signal required by the QM IC 87.

Similarly the inverse $\overline{Q}$ signal output from the phase equalizer 62 is connected to a single ended to differential amplifier 92, which operates as described above in connection with the single ended to differential amplifier 86 to provide the Q and inverse $\overline{Q}$ signals to the QM IC 87. If the QH IC 87 did not require both the I, Q signals and the inverse $\overline{I}$, $\overline{Q}$ signals as inputs, the single ended to differential amplifiers 86 and 92 could be eliminated from the circuit.

The quadrature modulator chip QM IC mixes the I and Q signal components with the output of the local oscillator 68 to produce a radio frequency signal within a transmit band, as described above in connection with FIG. 30

Component values of the components shown on the schematic diagram of FIGS. 4A and 4B are set forth below, it being understood that such values and the particular integrated circuits shown are merely exemplary in the sense that other components could alternatively be used in accordance with the present invention.

| Component(s) | Value | |
|---|---|---|
| R1–R4, R20 | 249 | KΩ |
| R5–R12, R15, R19, R21, R23–R24, R32–R34 | 10.0 | KΩ |
| R13, R16–R17, R20 | 2.74 | KΩ |

| Component(s) | Value | |
|---|---|---|
| —continued | | |
| R14, R18 | 3.01 | KΩ |
| R22, R25, R31, R35 | 1.00 | KΩ |
| R26–R30 | 4.75 | KΩ |
| C1, C9 | 2700 | pF |
| C4, C12 | 150 | pF |
| C5, 14 | 33 | pF |
| C6, C13 | 680 | pF |
| C7, C15 | 47 | pF |
| C8, C16 | 470 | pF |
| C18, C20, C22, C24–C25, C27, C29, C31 | 180 | pF |

All of the operational amplifiers (OP1–OP12) preferably comprise Analog Devices 0A471 operational amplifiers. Other components shown in the schematic (capacitors C2–C30 C10–C11, C17, C19, C21, C23, C26, C28, C30, C32 and inductors L1–L4) do not have set values but are included to allow for adjustments in the circuit and to compensate for irregularities in other components.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the system may be varied substantially without departing from the spirit of the invention, and the exclusive use of all modifications which are within the scope of the appended claims is reserved.

What is claimed is:

1. An apparatus for reducing noise in a transmitter, comprising:

filtering means for receiving a digitally modulated input signal and filtering noise from the signal;

a digital to analog converter for converting the input signal to an analog signal;

a differential to single ended amplifier for receiving the analog signal and providing the analog signal to the filtering means;

phase equalizing means for receiving an output of the filtering means and equalizing phase distortions in the input signal; and converting means for receiving an output of the phase equalizing means and converting the input signal to a radio frequency signal within a transmit band.

2. The apparatus of claim 1, wherein the filtering means comprises a first low pass filter for receiving an in-phase component of the input signal and a second low pass filter for receiving a quadrature phase component of the input signal.

3. The apparatus of claim 2, wherein the low pass filters comprise Chebyshev filters.

4. The apparatus of claim 2, wherein the phase equalizing means comprises a first phase equalizer connected to the first low pass filter and a second phase equalizer connected to the second low pass filter.

5. The apparatus of claim 1, further comprising a band pass filter for filtering the radio frequency signal.

6. The apparatus of claim 1, wherein the converting means comprises a quadrature modulator.

7. The apparatus of claim 6, further comprising a single ended to differential amplifier connected to an input of the quadrature modulator for receiving the input signal from the phase equalizing means and providing the signal to the quadrature modulator.

8. The apparatus of claim 1, wherein the input signal is a digitally modulated signal and further comprising a digital to analog converter for converting the input signal to an analog signal and providing the input signal to the filtering means.

9. An apparatus for reducing noise in a transmitter, comprising:
- a digital to analog converter adapted for converting a digitally modulated input signal to an analog input signal;
- a differential to single ended amplifier connected to the digital to analog converter;
- a low pass filter in communication with the amplifier for receiving the analog input signal and filtering noise from the signal, the low pass filter outputting a filtered signal;
- a phase equalizer in communication with the low pass filter for receiving the filtered signal from the low pass filter and equalizing phase distortions in the filtered signal; and
- an up-converter for receiving the filtered signal from the phase equalizer and converting the filtered signal to a radio frequency signal in a transmit band.

10. The apparatus of claim 9, wherein the low pass filter comprises a Chebyshev filter.

11. The apparatus of claim 9, wherein the input signal comprises an in-phase component and a quadrature phase component.

12. The apparatus of claim 11, wherein the low pass filter receives the in-phase component of the input signal and further comprising a second low pass filter for receiving the quadrature phase component of the input signal and filtering noise from the signal.

13. The apparatus of claim 12, wherein the phase equalizer equalizes the phase distortions in the in-phase component of the input signal and further comprising a second phase equalizer for receiving an output of the second low pass filter and equalizing phase distortions in the quadrature phase component of the input signal.

14. The apparatus of claim 9, wherein the up-converter comprises a quadrature modulator.

15. The apparatus of claim 9, wherein the input signal is a digitally modulated signal and further comprising a digital to analog converter for converting the signal to an analog signal and providing the analog signal to the low pass filter.

16. The apparatus of claim 9, further comprising a band pass filter for filtering an output of the up-converter.

* * * * *